United States Patent
Lai

(10) Patent No.: US 9,024,203 B2
(45) Date of Patent: May 5, 2015

(54) EMBEDDED PRINTED CIRCUIT BOARD AND METHOD FOR MANUFACTURING SAME

(71) Applicant: Zhen Ding Technology Co., Ltd., Tayuan, Taoyuan (TW)

(72) Inventor: Chien-Kuang Lai, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 133 days.

(21) Appl. No.: 13/928,701

(22) Filed: Jun. 27, 2013

(65) Prior Publication Data

US 2014/0124245 A1    May 8, 2014

(30) Foreign Application Priority Data

Nov. 2, 2012    (CN) .................. 2012 1 04322999

(51) Int. Cl.
*H05K 1/02*      (2006.01)
*H05K 1/18*      (2006.01)
*H05K 3/32*      (2006.01)
*H05K 3/46*      (2006.01)

(52) U.S. Cl.
CPC ................ *H05K 1/184* (2013.01); *H05K 1/183* (2013.01); *H05K 1/186* (2013.01); *H05K 3/323* (2013.01); *H05K 3/4602* (2013.01); *H05K 3/4652* (2013.01); *H05K 2201/0397* (2013.01); *H05K 2201/10636* (2013.01); *Y10T 29/49162* (2015.01)

(58) Field of Classification Search
CPC ............................... H05K 1/183; H05K 3/323
See application file for complete search history.

(56) References Cited

FOREIGN PATENT DOCUMENTS

TW      200731889 A      8/2007
TW      200742519 A      11/2007

*Primary Examiner* — Jeremy C Norris
(74) *Attorney, Agent, or Firm* — Novak Druce Connolly Bove + Quigg LLP

(57) ABSTRACT

A method for manufacturing an embedded printed circuit board includes the following steps. First, a circuit substrate is provided. The circuit substrate includes a base, a first wiring layer, and a second wiring layer. The first wiring layer includes a number of electrode connection wires. Second, an opening is defined in the circuit substrate. The opening passes through the base and the second wiring layer. Third, an anisotropic conductive film is adhered onto the electrode connection wires in the opening. Fourth, an electrical element including many electrodes is provided. Fifth, the electrical element is arranged in the opening, with the electrodes respectively spatially correspond to the electrode connection wires, and each electrode is electrically connected to the corresponding electrode connection wire through the anisotropic conductive film, thereby obtaining an embedded printed circuit board.

10 Claims, 8 Drawing Sheets

EMBEDDED PRINTED CIRCUIT BOARD AND METHOD FOR MANUFACTURING SAME

BACKGROUND

1. Technical Field

The present disclosure generally relates to printed circuit boards (PCBs), and particularly relates to an embedded printed circuit board and a method for manufacturing the embedded printed circuit board.

2. Description of Related Art

To accommodate development of miniaturized electronic products with multiple functions, embedded printed circuit boards are widely used.

A method of manufacturing the embedded printed circuit board includes following steps: forming a through hole in the circuit board; forming a supporting material layer at a side of the circuit board, the supporting material layer covering the through hole; arranging an electrical element in the through hole, and fixing the electrically element on the supporting material layer; laminating a first adhesive layer on the other side of the circuit board, such that the electrical element is adhesive to the first adhesive layer; removing the supporting material layer from the circuit substrate, and laminating a second adhesive sheet on the circuit substrate, such that the circuit substrate is sandwiched between the first adhesive sheet and the second adhesive sheet, and the electrical element is adhesive on the second adhesive sheet; respectively laminating a first copper layer and a second copper layer onto the first adhesive sheet and the second adhesive; respectively converting the first copper layer and the second layer into a first wiring layer and a second wiring layer, and forming a plurality of conductive vias by laser ablation and electroplating, such that the first wiring layer is electrically connected to electrodes of the electrical element through the conductive vias; respectively forming a first solder mask and a second solder mask on the first wiring layer and the second wiring layer, thereby obtaining an embedded printed circuit board. In the above method, when the electrodes of the electrical element are smaller, or alignment of laser ablation is not better, open circuit occurs. In addition, laser ablation may be damage the electrical element, and production efficiency is thus lower.

What is needed therefore is an embedded printed circuit board, and a method for manufacturing the embedded printed circuit board to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

A method for manufacturing an embedded printed circuit board includes the following steps.

Figure 1:
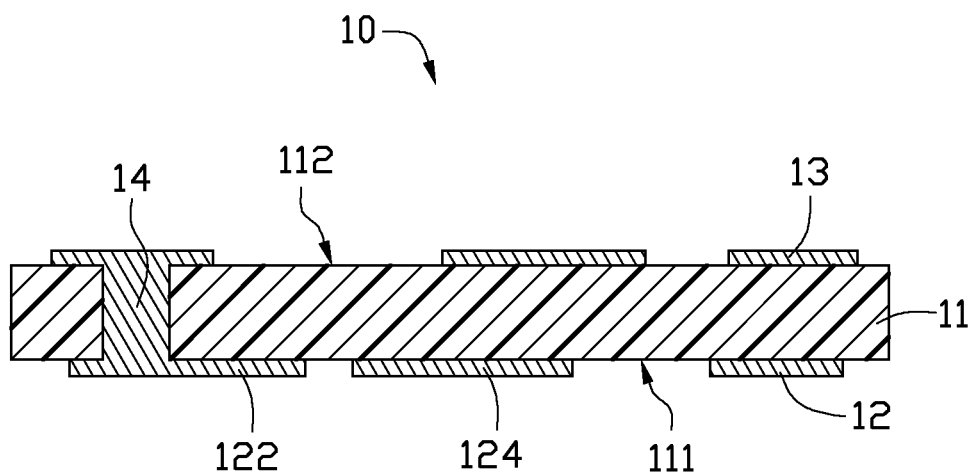
FIG. 1 shows a circuit substrate according to an exemplary embodiment.

FIG. 1 shows step 1, in which a circuit substrate 10 is provided. The circuit substrate 10 includes a base 11, a first wiring layer 12, and a second wiring layer 13. The first wiring layer 12 and the second wiring layer 13 are respectively arranged at opposite surfaces of the base 11.

In the present embodiment, the base 13 is an insulating base, for example rigid resin layer or flexible resin layer. In other embodiments, the base 13 may be a multilayer substrate, and includes a plurality of resin layers and a plurality of wiring layers (not shown). The resin layers and the wiring layers are arranged alternatively. The base 11 has a first surface 111 and a second surface 112 opposite to the first surface 111. The first wiring layer 12 is arranged on the first surface 111. The second wiring layer 13 is arranged on the second surface 112. The first wiring layer 12 is electrically connected to the second wiring layer 13 via first conductive via 14 in the base 11. In the present embodiment, the first wiring layer 12 and the second wiring layer 13 are formed by an image transfer process and an etching process. The first wiring layer 12 includes a first electrode connection wire 122 and a second electrode connection wire 124 adjacent to and separated from the first electrode connection wire 122.

Figure 2:
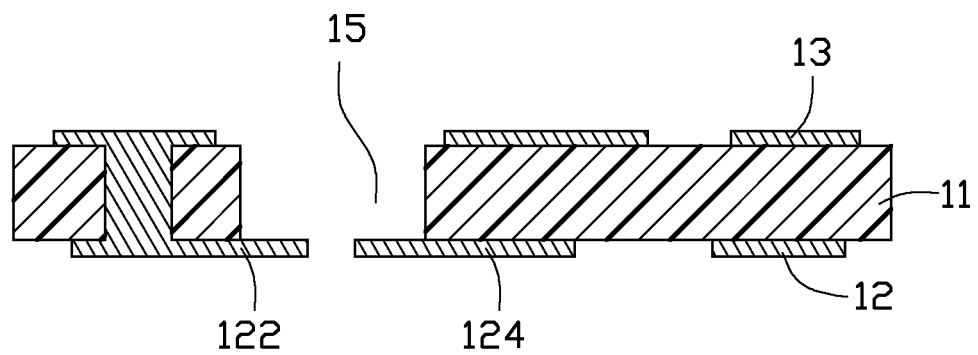
FIG. 2 shows an opening defined in the circuit substrate of FIG. 1.

FIG. 2 shows step 2, in which an opening 15 is defined at a position of the circuit substrate 10 spatially corresponding to the first electrode connection wire 122 and the second electrode connection wire 124. The opening 15 only passes through the second wiring layer 13 and the base 11, and does not pass through the first wiring layer 12. The first electrode connection wire 122 and the second electrode connection wire 124 expose outside from the opening 15. The opening 15 is configured for receiving an electrical element 17 (see FIG. 4). The opening 15 is formed by laser ablation.

Figure 3:
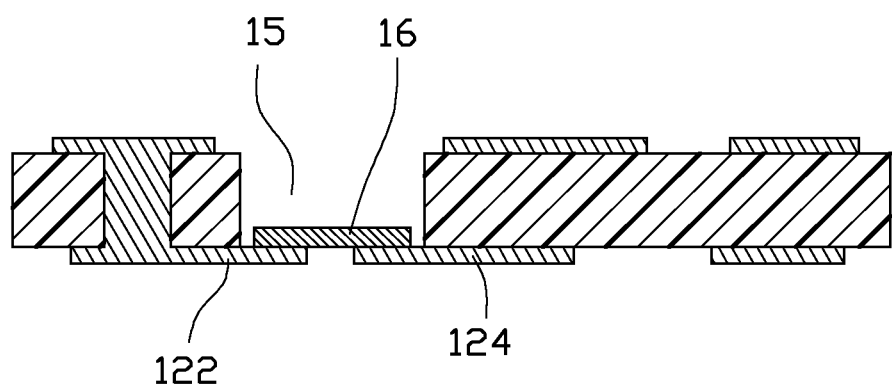
FIG. 3 shows an anisotropic conductive film formed on the portion of the first wiring layer exposed from the opening of FIG. 2.

FIG. 3 shows step 3, in which an anisotropic conductive film 16 is arranged in the opening 15, and is adhered onto the first electrode connection wire 122 and the second electrode connection wire 124.

Figure 4:
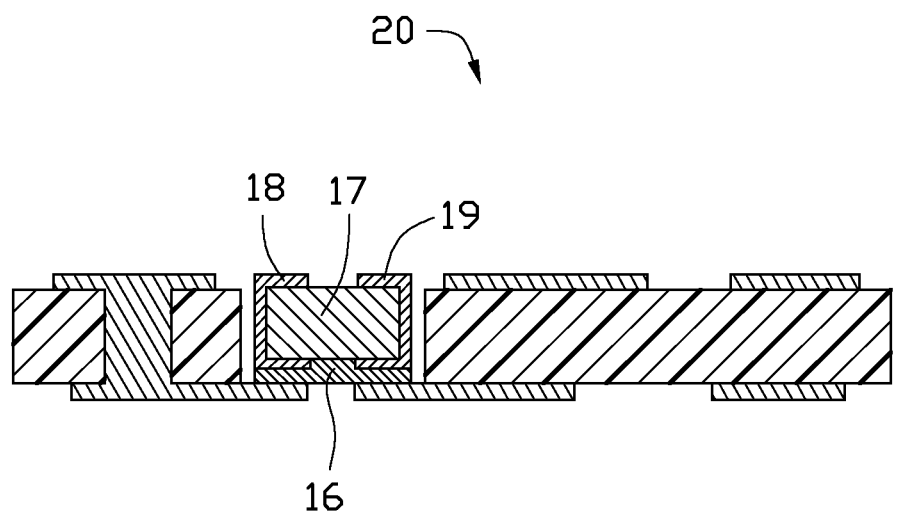
FIG. 4 shows a multilayer substrate with an electrical element and the anisotropic conductive film of FIG. 3.

FIG. 4 shows step 4, in which the electrical element 17 is provided. The electrical element 17 includes two electrodes 18 and 19. The electrical element 17 is adhered to the anisotropic conductive film 16 by a hot pressure method, such that the electrodes 18 and 19 are respectively opposite to the first electrode connection wire 122 and the second electrode connection wire 124. Accordingly, a multilayer substrate 20 is obtained.

In the present embodiment, the electrical element 17 is a chip capacitor, and the electrodes 18 and 19 are respectively positive anode and negative anode of the electrical element 17. Base on a special characteristic of the anisotropic conductive film 16, after hot pressure, the anisotropic conductive film 16 is conductive along a thickness direction of the anisotropic conductive film 16, and the surface of the anisotropic conductive film 16 is insulating. In the present embodiment, the thickness direction of the anisotropic conductive film 16 is a direction perpendicular to the surfaces of the first electrode connection wire 122 and the second electrode connection wire 124 in the opening 15, the electrodes 18 and 19 are thus respectively electrically connected to the first electrode connection wire 122 and the second electrode connection wire 124 through the anisotropic conductive film 16.

The electrodes of the electrical element 17 may be more than two, and the number of the electrode connection wires is same to that of the electrodes of the electrical element 17. There may be more electrical elements in the circuit substrate 10, in such case, more openings 15 should be defined in the circuit substrate 10, and there should be one anisotropic conductive film 16 in each opening 15.

Figure 5:
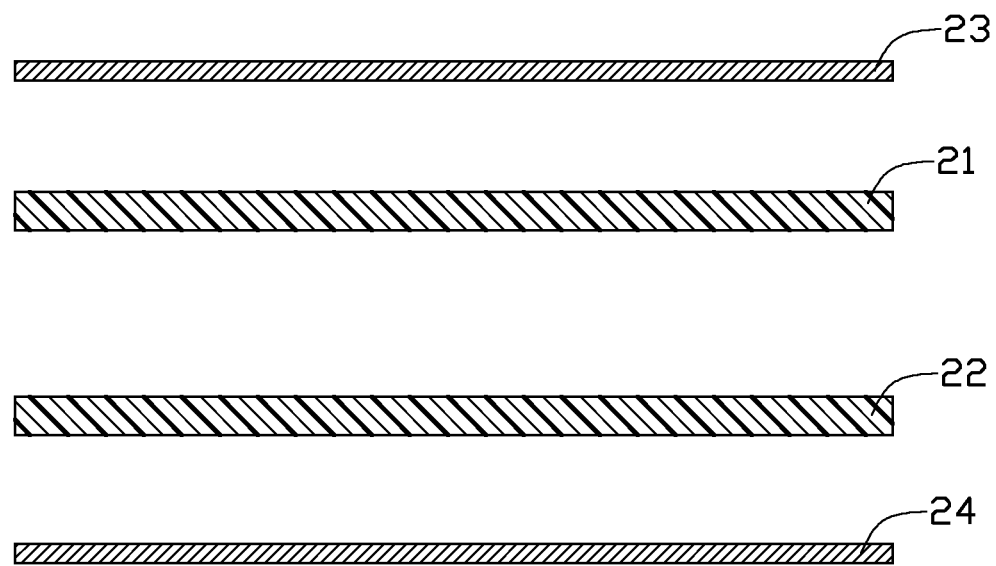
FIG. 5 shows a first adhesive sheet, a second adhesive sheet, a first copper layer, and a second copper layer.
Figure 6:
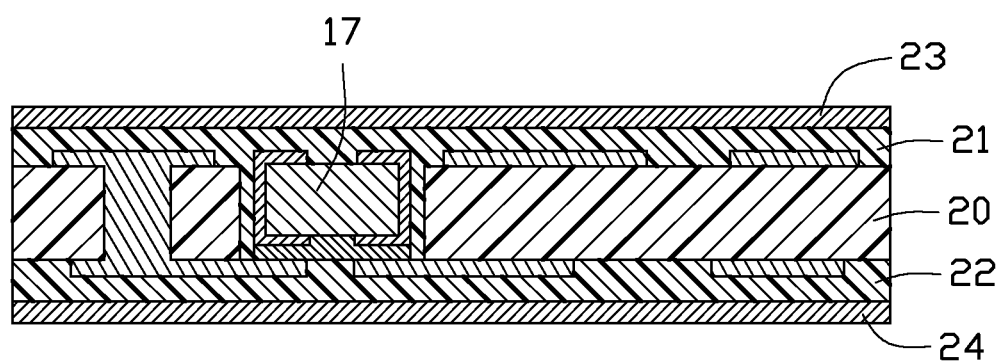
FIG. 6 shows a lamination of the first adhesive sheet, a second adhesive sheet, a first copper layer, a second copper layer of FIG. 5, and the multilayer substrate of FIG. 4.

FIGS. 5 and 6 show step 5, in which a first adhesive sheet 21, a second adhesive sheet 22, a first copper layer 23, and a second copper layer 24 are provided. Then, the first copper layer 23, the first adhesive sheet 21, the multilayer substrate 20, the second adhesive sheet 22 and the second copper layer 23 are stacked in the described order, and laminated onto each other at the same time.

After lamination, materials of the first adhesive sheet 21 and the second adhesive sheet 22 are filled into a gap between the electrical element 17 and the circuit substrate 10, gaps defined in the first wiring layer 12, and gaps defined in the second wiring layer 13, such that the first copper layer 23 and the second copper layer 24 are fixed onto the circuit board 10.

Figure 7:
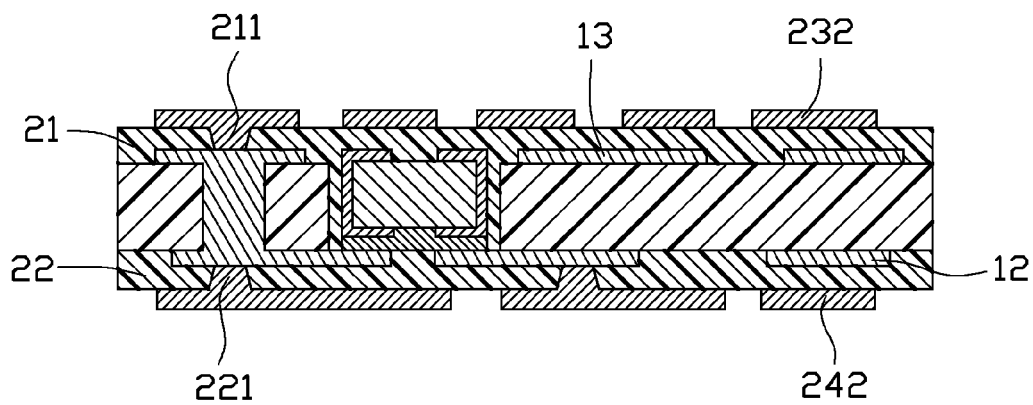
FIG. 7 shows a third wiring layer and a fourth wiring layer converted by the first copper layer and the second copper layer of FIG. 6.

FIG. 7 shows step 6, in which a second conductive via 211 is formed in the first adhesive sheet 21, a third conductive via 221 is formed in the second adhesive sheet 22, and the first copper layer 23 and the second copper layer 24 are respectively converted into a third wiring layer 232 and the fourth wiring layer 242. The second wiring layer 12 is electrically connected to the third wiring layer 13 through the second conductive via 211. The first wiring layer 12 is electrically connected to the fourth wiring layer 242 through the third conductive via 221.

The following steps may manufacture the second conductive via 211: an opening is defined in the first copper layer 23 and the first adhesive sheet 21 by laser ablation; then, the second conductive via 211 is formed by an electroplating process and a via filling process. A method of manufacturing the third conductive via 221 is same as the method of manufacturing the second conductive via 211. The third wiring layer 232 and the fourth wiring layer 242 may be formed by an image transfer process and an etching process.

Figure 8:
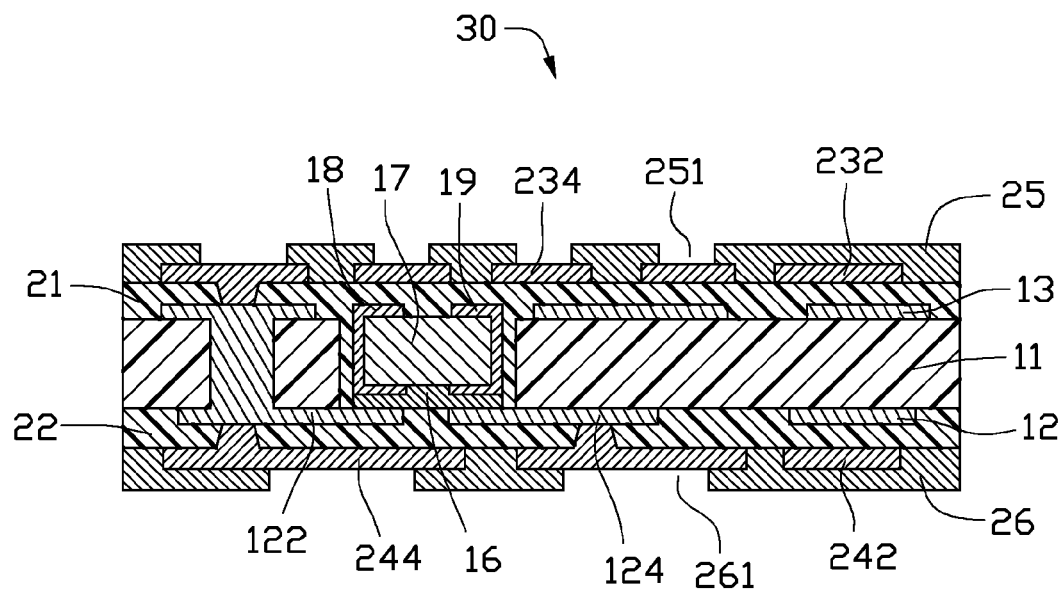
FIG. 8 shows a first solder mask and a second solder mask formed on the third wiring layer and the fourth wiring layer of FIG. 7 to obtain an embedded printed circuit board.

FIG. 8 shows step 7, in which a first solder mask 25 is formed on the third wiring layer 232 and in gaps defined in the third wiring layer 232, and a plurality of openings 251 are defined in the first solder mask 25, thereby enabling portions of the third wiring layer 232 exposed from the openings 251 to serve as contact pads 234; a second solder mask 26 is formed on the fourth wiring layer 242 and in gaps defined in the fourth wiring layer 242, and a plurality of openings 261 are defined in the second solder mask 26, thereby enabling portions of the fourth wiring layer 242 exposed from the openings 261 to serve as solder pads 244. An embedded printed circuit board 30 is thus obtained.

The contact pads 234 are configured for electrically connecting other electrical elements to the third wiring layer 232. The solder pads 244 are configured for electrically connecting the fourth wiring layer 242 to other circuit board. In order to prevent the contact pads 234 and the solder pads 244 oxidizing, the surfaces of the contact pads 234 and the solder pads 244 may be covered with golden layers.

It is understood that if more wiring layers are needed, more wiring layer can be formed by a build-up process before forming the first solder mask 25 and the second solder mask 26.

In actual production, from step 1 to step 7, the circuit substrate 10 usually includes a plurality of circuit substrate units connecting to each other. In step 7, after a plurality of embedded printed circuit boards 30 are connected to each other are manufactured, there is a cutting step to obtain a plurality of separated embedded printed circuit boards 30. In the present embodiment, in order to describe easily, only one circuit board 10 and only one embedded printed circuit board 30 are drawn.

FIG. 8 shows that the embedded printed circuit board 30 includes the base 11, the first wiring layer 12, the second wiring layer 13, the first adhesive sheet 21, the second adhesive 22, the third wiring layer 232, the fourth wiring layer 242, the first solder mask 25, a second solder mask 26, the anisotropic conductive film 16, and the electrical element 17.

The first wiring layer 12 and the second wiring layer 13 are respectively formed on the first surface 111 and the second surface 112, and the first wiring layer 12 is electrically connected to the second wiring layer 13 through the first conductive via 14. The first wiring layer 12 includes the first electrode connection wire 122 and the second electrode connection wire 124 adjacent to and separated from the first electrode connection wire 122. The opening 15 is defined at the position of the base 11 spatially corresponding to the first electrode connection wire 122 and the second electrode connection wire 124. The electrical element 17 is received in the opening 15, and is adhered to the first electrode connection wire 122 and the second electrode connection wire 124 through the anisotropic conductive film 16. The electrodes 18 and 19 of the electrical element 17 are respectively adjacent to the first electrode connection wire 122 and the second electrode connection wire 124, and electrically connected to the first electrode connection wire 122 and the second electrode connection wire 124 through the anisotropic conductive film 16. The first adhesive sheet 21 is formed on the second wiring layer 13. The second adhesive sheet 22 is formed on the first wiring layer 12. The third wiring layer 132 is formed on a side of the first adhesive sheet 21 further away from the second wiring layer 13. The fourth wiring layer 242 is formed on a side of the second adhesive sheet 22 further away from the first wiring layer 12. The third wiring layer 232 is electrically connected to the second wiring layer 13 through the second conductive via 211. The fourth conductive layer 242 is electrically connected to the first conductive layer 12 through the third conductive via 221. The first solder mask 25 partially covers the third wiring layer 232, and exposes the portions of the third wring layer 232 to define the contact pads 2354. The second solder mask 26 partially covers the fourth wiring layer 242, and exposes the portions of the fourth wiring layer 242 to define the solder pads 244.

In the method of manufacturing the embedded printed circuit board 30, the electrical element 17 is electrically connected to the first electrode connection wire 122 and the second electrode connection wire 124 by the anisotropic conductive film 16. A conductive via does not need to be formed to electrically connect the electrical element 17 to the first electrode connection wire 122 and the second electrode connection wire 124. In addition, because a conductive via does not need to be formed to electrically connect the electrical element to the first electrode connection wire 122 and the second electrode connection wire 124, no laser ablation is added thereto. The electrical element 17 is thus protected, and production efficiency is thus improved.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. An embedded printed circuit board, comprising:
a circuit substrate, the circuit substrate comprising a base, a first wiring layer, and a second wiring layer, the first wiring layer and the second wiring layer being respectively arranged at opposite surfaces of the base, the first wiring layer comprising a plurality of electrode connection wires, the circuit substrate defining an opening, the opening being spatially corresponding to the electrode connection wires, thereby exposing the electrode connection wires;
an anisotropic conductive film received in the opening and adhered on the electrode connection wires; and
an electrical element arranged in the opening of the circuit substrate, the electrical element comprising a plurality of electrodes, the electrodes respectively corresponding to the electrode connection wires, and each electrode being electrically connected to the corresponding electrode connection wire through the anisotropic conductive film.

2. The embedded printed circuit board of claim 1, further comprising a first adhesive sheet, a second adhesive sheet, a third wiring layer, and a fourth wiring layer, the first adhesive sheet being laminated on the second wiring layer, the second adhesive sheet being laminated on the first wiring layer, the third wiring layer being formed at a side of the first adhesive sheet further away from the second wiring layer, the fourth wiring layer being formed at a side of the second adhesive sheet further away from the first wiring layer, the third wiring layer being electrically connected to the second wiring layer through a conductive via in the first adhesive sheet, and the fourth wiring layer being electrically connected to the first wiring layer through a conductive via in the second adhesive sheet.

3. The embedded printed circuit board of claim 1, further comprising a first solder mask and a second solder mask, the first solder mask being formed on first the third wiring layer and in gaps defined in the third wiring layer, and defining a plurality of openings in the first solder mask, thereby enabling portions of the third wiring layer exposed from the openings in the first solder mask to serve as contact pads, the second solder mask being formed on the fourth wiring layer and in gaps defined in the fourth wiring layer, defining a plurality of openings in the second solder mask, thereby enabling portions of the fourth wiring layer exposed from the openings in the second solder mask to serve as solder pads.

4. The embedded printed circuit board of claim 1, wherein the base is an insulating resin layer, and the first wiring layer is electrically connected to the second wiring layer through a conductive via in the base.

5. The embedded printed circuit board of claim 1, the electrode connection wires are two electrode connection wires adjacent to and separated from each other, and the electrodes are two electrodes respectively corresponding to the two electrode connection wires.

6. A method for manufacturing an embedded printed circuit board, comprising:
providing a circuit substrate, the circuit substrate comprising a base, a first wiring layer, and a second wiring layer, the first wiring layer and the second wiring layer being respectively arranged at opposite surfaces of the base, the first wiring layer comprising a plurality of electrode connection wires;
defining an opening in the circuit substrate at a position spatially corresponding to the electrode connection wires, the opening passing through the base and the second wiring layer;
arranging an anisotropic conductive film in the opening and adhering the anisotropic conductive film onto the electrode connection wires;
providing an electrical element, the electrical element comprising a plurality of electrodes;
arranging the electrical element in the opening, with the electrodes respectively spatially correspond to the electrode connection wires, and each electrode electrically connected to the corresponding electrode connection wire through the anisotropic conductive film, thereby obtaining an embedded printed circuit board.

7. The method of claim 6, wherein after arranging the electrical element in the opening, the method further comprises:
laminating a first adhesive sheet and a first copper layer onto the second wiring layer, such that the first adhesive sheet is sandwiched between the first copper layer and the second wiring layer, and laminating a second adhesive sheet and a second copper layer onto the first wiring layer, such that second adhesive sheet is sandwiched between the second copper layer and the first wiring layer; and
patterning the first copper layer into a third wiring layer, patterning the second copper layer into a fourth wiring layer, electrically connecting the first wiring layer and the fourth wiring layer, and electrically connecting the second wiring layer and the third wiring layer.

8. The method of claim 7, wherein after patterning the first copper layer into a third wiring layer, patterning the second copper layer into a fourth wiring layer, electrically connecting the first wiring layer and the fourth wiring layer, and electrically connecting the second wiring layer and the third wiring layer, the method further comprises:
forming a first solder mask on the third wiring layer and in gaps defined in the third wiring layer, defining a plurality of openings in the first solder mask, thereby enabling portions of the third wiring layer exposed from the openings in the first solder mask to serve as contact pads, and forming a second solder mask on the fourth wiring layer and in gaps defined in the fourth wiring layer, defining a plurality of openings in the second solder mask, thereby enabling portions of the fourth wiring layer exposed from the openings in the second solder mask to serve as solder pads.

9. The method of claim 6, wherein the opening in the circuit substrate is defined by laser ablation.

10. The method of claim 6, wherein the electrode connection wires are two electrode connection wires adjacent to and separated from each other.

* * * * *